United States Patent
Seo et al.

(10) Patent No.: US 11,706,939 B2
(45) Date of Patent: Jul. 18, 2023

(54) LUMINESCENCE DEVICE, AND DISPLAY DEVICE INCLUDING SAME

(71) Applicant: Samsung Display Co., Ltd., Yongin-si (KR)

(72) Inventors: Dongkyu Seo, Yongin-si (KR); Wonjong Kim, Suwon-si (KR); Yeongrong Park, Osan-si (KR); Hyeongpil Kim, Hwaseong-si (KR); Junghee An, Hwaseong-si (KR); Byeongwook Yoo, Hwaseong-si (KR); Byungseok Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 16/684,325

(22) Filed: Nov. 14, 2019

(65) Prior Publication Data

US 2020/0266382 A1      Aug. 20, 2020

(30) Foreign Application Priority Data

Feb. 18, 2019   (KR) .................. 10-2019-0018645

(51) Int. Cl.
| | |
|---|---|
| *H01L 51/00* | (2006.01) |
| *H10K 50/818* | (2023.01) |
| *H10K 50/82* | (2023.01) |
| *H10K 50/115* | (2023.01) |

(Continued)

(52) U.S. Cl.
CPC ......... *H10K 50/818* (2023.02); *H10K 50/115* (2023.02); *H10K 50/82* (2023.02); *H10K 50/841* (2023.02); *H10K 85/351* (2023.02)

(58) Field of Classification Search
CPC ............. H01L 51/0089; H01L 51/5218; H01L 51/5221; H10K 50/818; H10K 50/82; H10K 50/80518; H10K 50/8052
See application file for complete search history.

(56) References Cited

U.S. PATENT DOCUMENTS

| | | |
|---|---|---|
| 9,997,733 B2 | 6/2018 | Seo et al. |
| 10,020,469 B2 | 7/2018 | Lee |
| 2007/0145894 A1 | 6/2007 | Satou et al. |

(Continued)

FOREIGN PATENT DOCUMENTS

| | | |
|---|---|---|
| KR | 10-1588298 B1 | 2/2016 |
| KR | 10-2016-0060214 A | 5/2016 |

(Continued)

OTHER PUBLICATIONS

"Periodic Table of Elements" downloaded from https://pubchem.ncbi.nlm.nih.gov/periodic-table/pdf/Periodic_Table_of_Elements_w_Chemical _Group_Block_PubChem.pdf (2020). (Year: 2020).*

*Primary Examiner* — Michele Fan
(74) *Attorney, Agent, or Firm* — Lewis Roca Rothgerber Christie LLP

(57) ABSTRACT

A luminescence device includes a first electrode, a first emission portion disposed on the first electrode, a second electrode disposed on the first emission portion, and a capping layer disposed on the second electrode and including a metal atom and a metal halide compound, wherein the metal atom is a lanthanide metal, a transition metal, or a post-transition metal and the metal halide compound is formed by combining an alkali metal atom and a halogen atom.

18 Claims, 7 Drawing Sheets

(51) Int. Cl.
*H10K 50/84* (2023.01)
*H10K 85/30* (2023.01)

(56) References Cited

U.S. PATENT DOCUMENTS

| | | | |
|---|---|---|---|
| 2008/0157656 A1* | 7/2008 | Liao | B82Y 30/00 |
| | | | 313/504 |
| 2013/0230692 A1* | 9/2013 | Yanase | H01L 31/0392 |
| | | | 428/141 |
| 2016/0329521 A1 | 11/2016 | Kim et al. | |
| 2016/0351845 A1* | 12/2016 | Kim | H01L 51/5072 |
| 2017/0025631 A1 | 1/2017 | Kim et al. | |
| 2017/0162828 A1* | 6/2017 | Mackerron | H01L 51/5221 |
| 2017/0186981 A1* | 6/2017 | Han | H01L 51/0079 |
| 2018/0269265 A1* | 9/2018 | Kim | H01L 51/5278 |
| 2019/0013492 A1* | 1/2019 | Jankus | H01L 51/5206 |
| 2019/0165304 A1* | 5/2019 | Kim | H01L 27/3248 |

FOREIGN PATENT DOCUMENTS

| | | |
|---|---|---|
| KR | 10-2016-0132190 A | 11/2016 |
| KR | 10-2017-0012708 A | 2/2017 |
| KR | 10-2017-0049766 A | 5/2017 |

\* cited by examiner

LUMINESCENCE DEVICE, AND DISPLAY DEVICE INCLUDING SAME

CROSS-REFERENCE TO RELATED APPLICATIONS

This application claims priority to and the benefit of Korean Patent Application No. 10-2019-0018645, filed on Feb. 18, 2019, the entire content of which is hereby incorporated by reference.

BACKGROUND

1. Field

The present disclosure herein relates to a luminescence device and a display device including the same, and more particularly, to a luminescence device including a capping layer, which contains a metal atom and a metal halide compound, and a display device including the same.

2. Description of the Related Art

The development of a self-luminescence display device as an image display device is being actively conducted. Unlike a liquid crystal display device, a display device including a self-luminescence device is a display device in which holes and electrons injected from a first electrode and a second electrode are recombined in an emission layer, and a light emission material contained in the emission layer emits light to represent an image to display. On the other hand, various studies for improving light-extraction efficiency of a display device are being conducted.

SUMMARY

Aspects of embodiments of the present disclosure are directed toward a luminescence device which may maintain high-reliability under a high-temperature and/or high-humidity environment, and a display device including the same.

Aspects of embodiments of the present disclosure are directed toward a luminescence device having high light-extraction efficiency and a display device including the same.

An embodiment of the present disclosure provides a luminescence device including: a first electrode; a first emission portion; a second electrode; and a capping layer. The first emission portion may be disposed on the first electrode. The second electrode may be disposed on the first emission portion. The capping layer may be disposed on the second electrode. The capping layer may include a metal atom and a metal halide compound. The metal atom may contain at least one of a lanthanide metal, a transition metal, or a post-transition metal. The metal halide compound may be formed by combining an alkali metal atom and a halogen atom. The capping layer may not include an organic compound (or may not be an organic layer). The halogen atom may contain at least one of CI, Br, or I. The metal halide compound may contain at least one of LiI, NaI, KI, RbI, or CsI. The metal atom and the metal halide compound may be bonded to each other to form a ternary compound. The ternary compound may be represented by Formula 1 below:

  [Formula 1]

In Formula 1 above, X and Y each may independently be an alkali metal, a transition metal, or a post-transition metal. Z may be a halogen atom. n, m, and q each may independently be an integer of 1 to 5.

In Formula 1, X may be an alkali metal. Y may be a transition metal or a post-transition metal. n and m may each be 1. q may be 3.

The capping layer may include at least one of $KYbI_3$, $RbYbI_3$, $CsYbI_3$, $NaYbI_3$, $LiYbI_3$, $RbSmI_3$, $CsSmI_3$, $KSmI_3$, $NaSmI_3$, or $LiSmI_3$.

The luminescence device may further include an auxiliary capping layer. The auxiliary capping layer may be disposed on the capping layer. The auxiliary capping layer may be different in refractive index from that of the capping layer. The auxiliary capping layer may include an organic compound (or maybe an organic layer), and may not include the metal atom and the metal halide compound. The auxiliary capping layer may include the metal atom and the metal halide compound, and may not include the organic compound (or may not be an organic layer). The luminescence device may further include a thin film encapsulation layer. The thin film encapsulation layer may be directly disposed on the capping layer.

The first emission portion may include an emission layer. The emission layer may be an organic emission layer including an organic compound. The emission layer may be a quantum dot emission layer including a quantum dot.

The luminescence device may further include a second emission portion. The second emission portion may be disposed between the first emission portion and the second electrode. The first emission portion may include a first hole transport region, a first emission layer, and a first electron transport region. The first emission layer may be disposed on the first hole transport region. The first electron transport region may be disposed on the first emission layer. The second emission portion may include a second hole transport region, a second emission layer, and a second electron transport region. The second emission layer may be disposed on the second hole transport region. The second electron transport region may be disposed on the second emission layer. The capping layer may have a refractive index of 1.4-2.0 in a wavelength range of 280-780 nm.

In an embodiment of the present disclosure, a luminescence device may include: a first electrode; a hole transport region; an emission layer, an electron transport region; a second electrode; and a capping layer. The hole transport region may be disposed on the first electrode. The emission layer may be disposed on the hole transport region. The electron transport region may be disposed on the emission layer. The second electrode may be disposed on the electron transport region. The capping layer may be disposed on the second electrode. The capping layer may be formed of (or may include) a metal atom and a metal halide compound. The metal atom may contain at least one of a lanthanide metal, a transition metal, or a post-transition metal. The metal halide compound may be formed by combining an alkali metal atom and a halogen atom. The metal atom may contain at least one of Eu, Sm, or Yb. The metal halide compound may be formed by combining an alkali metal atom and an iodine atom.

In an embodiment of the present disclosure, a display device may include: a thin film transistor; and a luminescence device. The luminescence device may be disposed on the thin film transistor. The luminescence device may include a first electrode, a hole transport region, an emission layer, an electron transport region, a second electrode, and a capping layer. The hole transport region may be disposed on the first electrode. The emission layer may be disposed on the hole transport region. The electron transport region may be disposed on the emission layer. The second electrode may be disposed on the electron transport region. The capping layer may be disposed on the second electrode. The capping layer may include a metal atom and a metal halide compound. The metal atom may contain at least one of a lanthanide metal, a transition metal, or a post-transition metal. The metal halide compound may be formed by combining an alkali metal atom and a halogen atom. The metal atom may contain at least one of Eu, Sm, or Yb. The metal halide compound may contain at least one of LiI, NaI, KI, RbI, or CsI. The capping layer may include at least one of $KYbI_3$, $RbYbI_3$, $CsYbI_3$, $NaYbI_3$, $LiYbI_3$, $RbSmI_3$, $CsSmI_3$, $KSmI_3$, $NaSmI_3$, or $LiSmI_3$.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
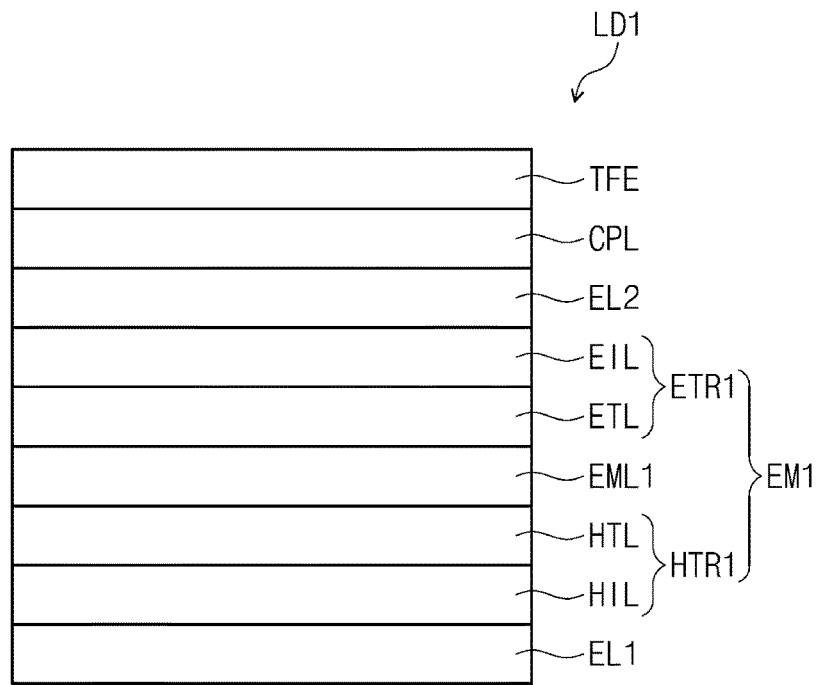
FIG. 1 is a cross-sectional view of a luminescence device according to an embodiment of the present disclosure.

It will be understood that when an element or layer is referred to as being "on," "connected to," or "coupled to" another element or layer, it can be directly on, connected to, or coupled to the other element or layer, or intervening element(s) or layer(s) may be present. In contrast, when an element is referred to as being "directly on," "directly connected to," or "directly coupled to" another element or layer, there are no intervening elements or layers present.

It will be understood that "the configuration of B is directly disposed on the configuration of A" means that no separate adhesion layer and/or adhesion member is disposed between the configuration of A and the configuration of B. That is, "being directly disposed" means "being contacted."

Like numbers refer to like elements throughout. The thickness and the ratio and the dimension of the element are exaggerated for effective description of the technical contents.

As used herein, the term "and/or" includes any and all combinations of one or more of the associated listed items.

It will be understood that, although the terms first, second, etc., may be used herein to describe various elements, components, regions, layers, and/or sections, these elements, components, regions, layers, and/or sections should not be limited by these terms. These terms are used only to distinguish one element, component, region, layer, or section from another element, component, region, layer, or section. Thus, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the description, it should be understood that each of the terms "comprise," "include," or "have" intends to mean that there may be specified features, numerals, steps, operations, elements, parts, or combinations thereof, not excluding the possibility of the presence or addition of the specified features, numerals, steps, operations, elements, parts, or combinations thereof.

Hereinafter, exemplary embodiments of the inventive concept will be described in detail with reference to the accompanying drawings.

FIG. 1 is a cross-sectional view of a luminescence device LD1 according to an embodiment of the present disclosure.

Referring to FIG. 1, the luminescence device LD1 according to an embodiment may include a first electrode EL1, a first emission portion EM1 disposed on the first electrode EL1, a second electrode EL2 disposed on the first emission portion EM1, and a capping layer CPL disposed on the second electrode EL2.

The capping layer CPL may include a metal atom and a metal halide compound. The detailed description will be described later.

The first emission portion EM1 may include a first hole transport region HTR1, a first emission layer EML1, and a first electron transport region ETR1.

The first electrode EL1 has conductivity. The first electrode EL1 may be formed of a metal alloy or a conductive compound. The first electrode EL1 may be an anode. The first electrode EL1 may also be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (e.g., a mixture of Ag and Mg). Alternatively, the first electrode EL1 may have a multi-layer structure including: a reflective film or a transflective film formed of the above materials; and a transparent conductive film formed of ITO, IZO, ZnO, ITZO, or the like. The first electrode EL1, for example, may have a three-layer structure of ITO/Ag/ITO, but the embodiment is not limited thereto.

A thickness of the first electrode EL1 may be about 1000-10000 Å, for example, about 1000-3000 Å.

The first hole transport region HTR1 may be disposed on the first electrode EL1. The first hole transport region HTR1 may include at least one of a hole injection layer HIL, a hole transport layer HTL, a hole buffer layer, or an electron blocking layer.

The first hole transport region HTR1 may have a structure of: a single layer formed of a single material; a single layer formed of a plurality of different materials; or a multi-layer having a plurality of layers formed of a plurality of different materials.

The first hole transport region HTR1 may be formed by using various methods such as a vacuum deposition method, a spin coating method, a casting method, a Langmuir-Blodgett (LB) method, an inkjet printing method, a laser printing method, and/or a laser induced thermal imaging (LITI) method.

A material of the first hole transport region HTR1 is not particularly limited, and may include a suitable material in the art and may further include a charge generating material to improve conductivity. The charge generating material may be uniformly or non-uniformly dispersed in the first hole transport region HTR1. The charge generating material may be, for example, a p-dopant.

A thickness of the first hole transport region HTR1 may be about 100-10000 Å, for example, about 100-5000 Å. A thickness of the hole injection layer HIL may be, for example, about 30-1000 Å, and a thickness of the hole transport layer HTL may be about 30-1000 Å. When the thicknesses of the first hole transport region HTR1, the hole injection layer HIL, the hole transport layer HTL, and the electron blocking layer satisfy the described ranges, the satisfying hole transport performance may be achieved without substantial rise of a driving voltage.

As described, the first hole transport region HTR may further include at least one of the hole buffer layer or the electron blocking layer in addition to the hole injection layer HIL and the hole transport layer HTL. The hole buffer layer may improve the light emission efficiency by compensating a resonance distance depending on the wavelength of the light emitted from the first emission layer EML1. The materials included in the first hole transport region HTR1 may also be used as materials included in the hole buffer layer. The electron blocking layer may serve to prevent electron injection from the first electron transport region ETR1 to the first hole transport region HTR1.

The first emission layer EML1 may be disposed on the first hole transport region HTR1. The first emission layer EML1 may have a thickness of, for example, about 100-1000 Å or about 100-300 Å. The first emission layer EML1 may have a structure of: a single layer formed of a single material; a single layer formed of a plurality of different materials; or a multi-layer having a plurality of layers formed of a plurality of different materials.

The first emission layer EML1 may be any one of an organic emission layer which includes an organic compound or a quantum dot emission layer which includes a quantum dot. That is, the luminescence device LD may be an organic electroluminescence device which includes an organic compound in an emission layer or a quantum dot electroluminescence device which includes a quantum dot emission layer in an emission layer.

The first emission layer EML1 in the luminescence device LD1 of an embodiment may include an organic compound such as an anthracene derivative, a pyrene derivative, a fluoranthene derivative, a chrysene derivative, a dihydrobenzanthracene derivative, and/or a triphenylene derivative. Specifically, the first emission layer EML1 may include an anthracene derivative and/or a pyrene derivative. However, the embodiment is not limited thereto, and the first emission layer EML1 may include suitable material(s) in the art without limitation.

The first emission layer EML1 may include a host material and a dopant material. The first emission layer EML1 may include suitable material(s) in the art as a host material and a dopant material.

Also, in the luminescence device LD1 of an embodiment, the first emission layer EML1 may include a quantum dot.

A core of the quantum dot may be selected from a Group II-VI compound, a Group III-V compound, a Group IV-VI compound, a Group IV element, a Group IV compound, and a combination thereof.

The Group II-VI compound may be selected from the group consisting of: a binary element compound (also referred to as a binary compound) selected from the group consisting of CdSe, CdTe, ZnS, ZnSe, ZnTe, ZnO, HgS, HgSe, HgTe, MgSe, MgS, and combinations thereof; a ternary element compound (referred to as a ternary compound) selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and combinations thereof; and a quaternary element compound (referred to as a quaternary compound) selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and combinations thereof.

The Group III-V compound may be selected from the group consisting of: a binary element compound selected from the group consisting of GaN, GaP, GaAs, GaSb, AlN, AlP, AlAs, AlSb, InN, InP, InAs, InSb, and combinations thereof; a ternary element compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, and combinations thereof; and a quaternary element compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and combinations thereof.

The Group IV-VI compound may be selected from the group consisting of: a binary element compound selected from the group consisting of SnS, SnSe, SnTe, PbS, PbSe, PbTe, and combinations thereof; a ternary element compound selected from the group consisting of SnSeS, SnSeTe, SnSTe, PbSeS, PbSeTe, PbSTe, SnPbS, SnPbSe, SnPbTe, and combinations thereof; and a quaternary element compound selected from the group consisting of SnPbSSe, SnPbSeTe, SnPbSTe, and combinations thereof. The Group IV element may be selected from the group consisting of Si, Ge, and combinations thereof. The Group IV compound may be a binary element compound selected from the group consisting of SiC, SiGe, and combinations thereof.

At this time, the binary element compound, the ternary element compound, or the quaternary element compound may be present in a particle at a uniform concentration or may be present in a particle in which a concentration distribution is partially divided into different states. Alternatively, the quantum dots may also have a core-shell structure in which one quantum dot surrounds the other quantum dot. An interface between the core and the shell may have a concentration gradient in which a concentration of the elements present in the shell becomes lowered toward the core.

In some embodiments, the quantum dot may have a core-shell structure including a core which contains the described nanocrystal and a shell which surrounds the core. The shell of the quantum dot may serve as a protective layer for maintaining semiconductor characteristics by preventing (or protecting from) chemical denaturation of the core and/or as a charging layer for giving electrophoresis characteristics to the quantum dot. The shell may have a single layer or multi-layers. An interface between the core and the shell may have a concentration gradient in which a concentration of the elements present in the shell becomes lowered toward the core. The shell of the quantum dot may include, for example, a metal or nonmetal oxide, a semiconductor compound, or a combination thereof.

For example, the metal or nonmetal oxide may include: a binary element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; and/or a ternary element compound such as $MgAl_2O_4$, $CoFe_2O_4$, $NiFe_2O_4$, and/or $CoMn_2O_4$, but the inventive concept is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the inventive concept is not limited thereto.

The quantum dot may have a full width of half maximum (FWHM) of an emission wavelength spectrum of about 45 nm or less, preferably about 40 nm or less, more preferably about 30 nm or less, and color purity or color reproducibility may be improved in the described range. In addition, light emitted through the quantum dot is emitted in all directions, thereby improving a viewing angle of the light.

Furthermore, a shape of the quantum dot is not limited to the specific shape typically used in the art, but more specifically, a nanoparticle (having a spherical shape, a pyramidal shape, a multi-arm shape, and/or a cubic shape), a nanotube, a nanowire, a nanofiber, a nanoplate particle, and/or the like may be used.

The quantum dot may adjust color of the emitted light depending on the particle size, and accordingly, the quantum dot may have various emission colors such as blue, red, and/or green.

The first electron transport region ETR1 may be disposed on the first emission layer EML1. The first electron transport region ETR1 may include at least one of a hole blocking layer, an electron transport layer ETL, or an electron injection layer EIL, but the embodiment is not limited thereto.

The first electron transport region ETR1 may have a structure of: a single layer formed of a single material; a single layer formed of a plurality of different materials; or a multi-layer having a plurality of layers formed of a plurality of different materials.

The first electron transport region ETR1 may be formed by using various methods such as a vacuum deposition method, a spin coating method, a casting method, a Langmuir-Blodgett (LB) method, an inkjet printing method, a laser printing method, and/or a laser induced thermal imaging (LITI) method.

When the first electron transport region ETR1 includes an electron transport layer ETL, the first electron transport region ETR1 may include an anthracene-based compound. However, the embodiment is not limited thereto, and the first electron transport region ETR1 may include suitable material(s) in the art.

Thicknesses of the electron transport layers ETL may be about 100-1000 Å, for example, about 150-500 Å. When the thicknesses of the electron transport layers ETL satisfy the described ranges, the satisfying electron transport performance may be achieved without substantial rise of a driving voltage.

Thicknesses of the electron injection layers EIL may be about 1-100 Å, for example, about 3-90 Å. When the thicknesses of the electron injection layers EIL satisfy the described ranges, the satisfying electron injection performance may be achieved without substantial rise of a driving voltage.

The first electron transport region ETR1 may include a hole blocking layer as described above. The hole blocking layer may contain, for example, at least one of 2,9-dimethyl-4,7-diphenyl-1,10-phenanthroline (BCP) or 4,7-diphenyl-1,10-phenanthroline (Bphen), but the embodiment is not limited thereto.

The second electrode EL2 may be disposed on the first electron transport region ETR1. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be formed of transparent metal oxide, for example, indium tin oxide (ITO), indium zinc oxide (IZO), zinc oxide (ZnO), indium tin zinc oxide (ITZO), or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (e.g., a mixture of Ag and Mg). Alternatively, the second electrode EL2 may be a structure which has a plurality of layers including: a reflective layer or a transflective layer formed of the described materials; and a transparent conductive layer formed of ITO, IZO, ZnO, ITZO, or the like.

In some embodiments, the second electrode EL2 may be connected to an auxiliary electrode. When the second electrode EL2 is connected to the auxiliary electrode, resistance of the second electrode EL2 may be reduced.

The capping layer CPL may be disposed on the second electrode EL2. The capping layer CPL may be directly disposed on the second electrode EL2.

The capping layer CPL may include a metal atom and a metal halide compound. The metal atom may contain at least one of a lanthanide metal, a transition metal, or a post-transition metal.

The lanthanide metal may contain at least one of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu), and more specifically, the lanthanide metal may be europium (Eu), samarium (Sm), or ytterbium (Yb).

The metal halide compound may be formed by combining an alkali metal atom and a halogen atom. The alkali metal may contain at least one of lithium (Li), sodium (Na), potassium (K), rubidium (Rb), or cesium (Cs). The halogen atom may be fluorine (F), chlorine (Cl), bromine (Br), or iodine (I).

For example, the halogen atom may contain at least one of chlorine (Cl), bromine (Br), or iodine (I). More specifically, the halogen atom may contain at least one of iodine (I). Since F has a small atomic radius, it may be difficult to react with a metal atom and form a ternary compound which will be described later, and accordingly, the halogen atom may be preferably Cl, Br, or I.

For example, the metal halide compound may be formed by combining an alkali metal atom and an iodine atom. Specifically, the metal halide compound may contain at least one of LiI, NaI, KI, RbI, or CsI.

Hereinafter, the metal atom used herein means at least one of a lanthanide metal, a transition metal, or a post-transition metal. Hereinafter, the metal halide compound used herein means a compound in which an alkali metal atom and a halogen atom are combined.

The metal atom and the metal halide compound may combine with each other to form a ternary compound. The ternary compound may be represented by Formula 1 below:

$$X_n Y_m Z_q \quad \text{[Formula 1]}$$

In Formula 1, X and Y may each independently be an alkali metal, a transition metal, or a post-transition metal, Z may be a halogen atom, and n, m, and q may each independently be an integer of 1 to 5.

In Formula 1, for example, X may be an alkali metal and Y may be a transition metal or a post-transition metal.

m and n may be the same as or different from each other. For example, m and n may each be 1, and q may be 3. That is, Formula 1 may be represented by Formula 2 below:

$$XYZ_3 \quad \text{[Formula 2]}$$

However, the embodiment is not limited thereto, and n, m, and q may each suitably be selected depending on the kinds of X, Y, and Z elements in Formula 1.

The ternary compound may contain at least one of $KYbI_3$, $RbYbI_3$, $CsYbI_3$, $NaYbI_3$, $LiYbI_3$, $RbSmI_3$, $CsSmI_3$, $KSmI_3$, $NaSmI_3$, or $LiSmI_3$. Specifically, the ternary compound may be $RbYbI_3$.

The metal atom and the metal halide compound included in the capping layer CPL may be presented as a ternary compound form. Alternatively, the metal atom and the metal halide compound may be present as a mixture form of a metal atom, a metal halide compound, and a ternary compound.

The capping layer CPL may not include an organic compound. That is, the capping layer CPL may be formed only of an inorganic material. More specifically, the capping layer CPL may include only a metal atom and a metal halide compound.

Typically, a capping layer in a luminescence device includes an organic material. When a capping layer is formed by using an organic material, there may be a problem such that reliability is lowered under a high-temperature and high-humidity environment and there may also be a limit of high-cost. Meanwhile, the luminescence device LD1 according to an embodiment includes a capping layer CPL which contains an inorganic material. Accordingly, the luminescence device LD1 according to an embodiment may maintain high-reliability even under a high-temperature and high-humidity environment and manufacture and process costs may also be reduced (to be described later).

On the other hand, when light is emitted from the first emission layer EML1 in the luminescence device LD1 according to an embodiment, a refraction or reflection degree of the light may differ depending on a refractive index of an upper component, and accordingly, the light-extraction efficiency of the luminescence device LD1 may differ. Therefore, it may be necessary to appropriately adjust the refractive index of the component disposed on the upper portion of the emission layer to improve the light-extraction efficiency. For example, when the luminescence device LD1 has a resonance structure, it may be necessary to differently adjust the refractive index of the capping layer CPL depending on a resonance distance to improve the light-extraction efficiency.

When a capping layer is formed of an organic material (as is typically done), it may be difficult to form a capping layer which is out of a refractive index range of about 1.5-1.7 because an organic material has a small refractive index range. Accordingly, it may be difficult to manufacture a slim display device DD (FIG. 4) because a separate optical layer having a desired refractive index is inserted to improve the light-extraction efficiency.

On the other hand, the capping layer CPL according to an embodiment includes both a metal atom and a metal halide compound, so that the refractive index of the capping layer CPL may be easily adjusted and capping layers CPL having various refractive indices may be formed.

A metal atom has a high refractive index and a metal halide compound has a low refractive index, and accordingly, a capping layer CPL having a desired refractive index may be easily formed by adjusting a ratio of a metal atom and a metal halide compound. Specifically, the capping layer CPL of an embodiment may have the refractive index in a wide range of about 1.4-2.0 on the basis of the light having a wavelength range of about 380-780 nm.

When a capping layer includes only a metal atom, the light-extraction efficiency may be deteriorated because of the opaque properties of the metal atom, and accordingly, it may be inappropriate to use the metal atom alone as a capping layer material.

On the other hand, in an embodiment, the capping layer CPL includes both a metal atom and a metal halide compound simultaneously, so that the metal atom may react with the metal halide compound and a ternary compound may be formed. In an embodiment, although the metal atom is used as a capping layer CPL material, the light-extraction efficiency may not be deteriorated because the formed ternary compound has transparent properties.

The capping layer CPL may have a thickness of about 100-1000 Å. When the thickness of the capping layer CPL satisfies the described range, the light-extraction efficiency may be improved while sufficiently protecting the organic compound included in the first emission portion EM1 from a high-temperature and humidity.

The luminescence device LD1 may further include a thin film encapsulation layer TFE disposed on the capping layer CPL. The thin film encapsulation layer TFE may be directly disposed on the capping layer CPL. In some embodiments, an input sensing unit for sensing touch of users, etc., may be further disposed on the thin film encapsulation layer TFE.

When the thin film encapsulation layer TFE is directly disposed on the capping layer CPL, the light emitted from the first emission layer EML1 may pass through the thin film encapsulation layer TFE, thereby deteriorating the light-extraction efficiency. Also, in the luminescence device LD1 of an embodiment, the capping layer CPL having an appropriate range of a refractive index may be formed, and accordingly, the optical efficiency deterioration may be complemented.

Figure 2:
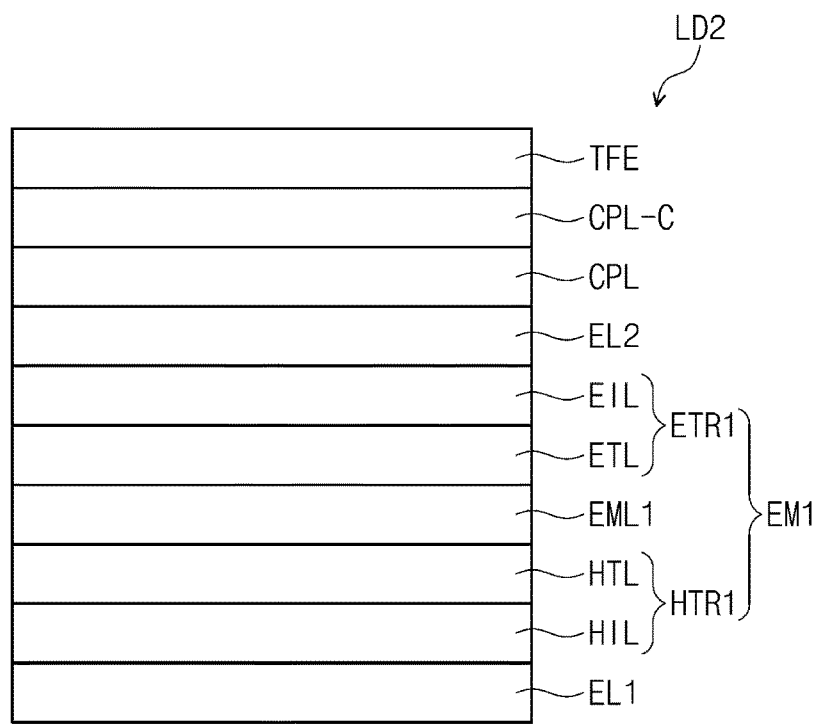
FIG. 2 is a cross-sectional view of a luminescence device according to an embodiment of the present disclosure.
Figure 3:
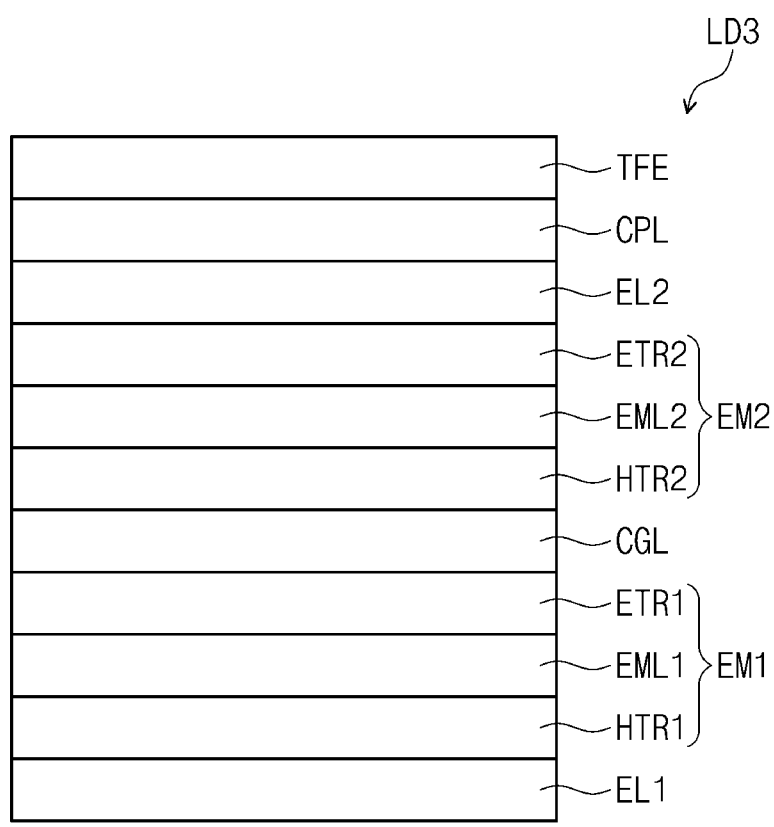
FIG. 3 is a cross-sectional view of a luminescence device according to an embodiment of the present disclosure.

FIG. 2 is a cross-sectional view of a luminescence device LD2 according to an embodiment of the present disclosure. FIG. 3 is a cross-sectional view of a luminescence device LD3 according to an embodiment of the present disclosure. For the same configuration as that of the luminescence device LD1 illustrated in FIG. 1 in the configurations of the luminescence devices LD2 and LD3 illustrated in FIGS. 2 and 3, the described embodiments may be applied substantially equally. Therefore, hereinafter, the repeated description for the luminescence devices LD2 and LD3 may not be provided again.

Referring to FIG. 2, the luminescence device LD2 may further include an auxiliary capping layer CPL-C disposed on the capping layer CPL. The auxiliary capping layer CPL-C may have a refractive index different from the capping layer CPL. For example, when the capping layer CPL has a refractive index of about 2.0, the auxiliary capping layer CPL-C may have a refractive index of about 1.6.

As a plurality of capping layers CPL and CPL-C having different refractive indices are disposed, optical efficiency of the luminescence device LD2 may be improved.

The auxiliary capping layer CPL-C may contain a metal atom and a metal halide compound. The auxiliary capping layer CPL-C, for example, may be formed of a metal atom and a metal halide compound. However, the material of the auxiliary capping layer CPL-C is not particularly limited thereto and may contain suitable capping layer material(s) in the art.

For example, the auxiliary capping layer CPL-C may be contain an organic material (or may be an organic layer). Alternatively, both a metal atom and a metal halide compound may be contained (and, e.g., not be an organic layer) in the auxiliary capping layer CPL-C. Alternatively, the auxiliary capping layer CPL-C may contain an organic material and contain the metal atom and the metal halide compound.

When the auxiliary capping layer CPL-C is the organic layer that, e.g., contains an organic compound, the auxiliary capping layer CPL-C may contain, for example, α-NPD, NPB, TPD, m-MTDATA, Alq$_3$, CuPc, N4,N4,N4',N4'-tetra (biphenyl yl)biphenyl-4,4'-diamine (TPD15), 4,4',4"-tris (carbazol-9-yl)triphenylamine (TCTA), N,N'-bis(naphthalen-1-yl), and/or the like.

The auxiliary capping layer CPL-C may contain materials that are the same as or different from the capping layer CPL materials.

For example, the auxiliary capping layer CPL-C may contain a metal atom and a metal halide compound which are the same as or different from the capping layer CPL materials. When the metal atom and the metal halide compound contained in the capping layer CPL and the metal atom and the metal halide compound contained in the auxiliary capping layer CPL-C are the same, ratios of the metal atom and the metal halide compound contained in the capping layer CPL and the auxiliary capping layer CPL-C may be different from each other.

In FIG. 2, the capping layers CPL and CPL-C are stacked in two layers, but the embodiment is not limited thereto, and three or more layers may also be stacked.

Referring to FIG. 3, the luminescence device LD3 may further include a second emission portion EM2. The second emission portion EM2 may be disposed between the first emission portion EM1 and the second electrode EL2.

The second emission portion EM2 may include a second hole transport region HTR2, a second emission layer EML2, and a second electron transport region ETR2 which are sequentially stacked.

The described embodiments of the first hole transport region HTR1, the first emission layer EML1, and the first electron transport region ETR2 may be applied substantially the same to the second hole transport region HTR2, the second emission layer EML2, and the second electron transport region ETR2, respectively.

FIG. 3 illustrates that the luminescence device LD3 includes two emission portions EM1 and EM2, but the embodiment is not limited thereto, and three or more emission portions may also be included.

Each of the plurality of emission portions EM1 and EM2 may emit the same color light or may emit different color light from each other. For example, all of the emission portions EM1 and EM2 may emit blue light. Alternatively, when the luminescence device LD3 includes three emission portions, the emission portions may emit red light, green light, and blue light, respectively. However, the embodiment is not limited thereto, and each of the emission portions EM1 and EM2 may emit light having various wavelength ranges.

The plurality of emission portions EM1 and EM2 may be disposed in the luminescence device LD1 of an embodiment, thereby improving current efficiency and achieving a long-lifetime of the device.

The luminescence device LD3 may further include a charge generation layer CGL. The charge generation layer CGL may be disposed between the emission portions EM1 and EM2.

A charge may be generated when a voltage is applied to the charge generation layer CGL. The charge generation layer CGL may be disposed between the emission portions EM1 and EM2 and may serve to adjust a charge balance between the emission portions EM1 and EM2. For example, the charge generation layer CGL may serve to assist electron injection into the first emission portion EM1 and assist hole injection into the second emission portion EM2.

The charge generation layer CGL may be configured to be one layer in which an electron injection material and a hole injection material are mixed. Alternatively, the charge generation layer CGL may be configured to be two or more layers. For example, the charge generation layer CGL may include an N-type charge generation layer doped with an N-type dopant and a P-type charge generation layer doped with a P-type dopant. The N-type charge generating layer may be disposed directly or adjacent to the first electron transport region ETR1 and may serve to assist electron injection, and the P-type charge generating layer may be disposed directly on or adjacent to a lower portion of the second hole transport region HTR2 and may serve to assist hole injection.

A material of the charge generation layer CGL is not particularly limited, and suitable material(s) in the art may be used without limitation.

As the number of emission portions in the luminescence device LD3 is adjusted, a required refractive index of the capping layer CPL also differs. The capping layer CPL of an embodiment may easily adjust the refractive index, thereby easily improving light-extraction efficiency of the luminescence device LD3 which includes a plurality of emission portions.

Hereinafter, a display device DD (including a luminescence device) according to an embodiment of the present disclosure will be described with reference to FIGS. 4 to 6. In the display devices DD, DD-1, and DD-2 of an embodiment, the described devices may be applied substantially equally to the same configurations as those of the luminescence devices LD1, LD2, and LD3 illustrated in FIGS. 1 to 3. Therefore, hereinafter, the repeated embodiments described with reference to FIGS. 1 to 3 may not be provided again.

Figure 4:
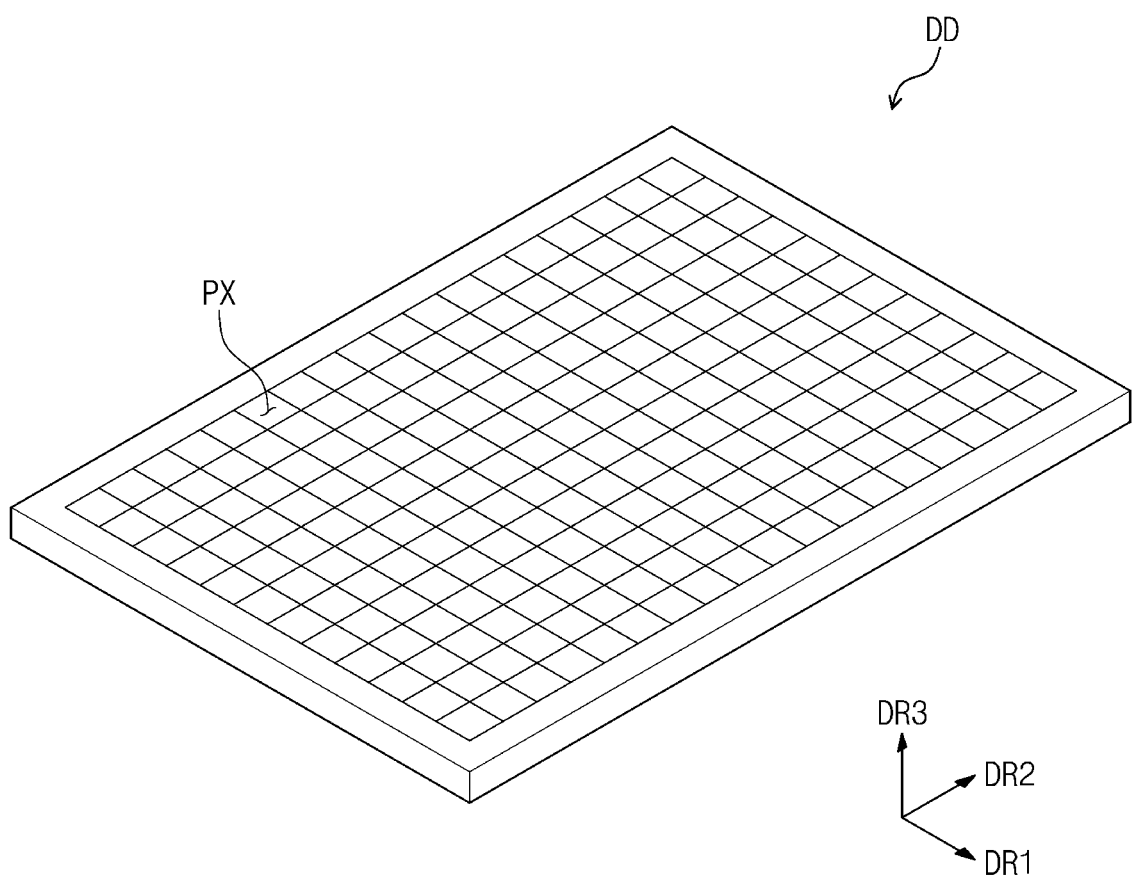
FIG. 4 is a perspective view of a display device (a luminescence device) according to an embodiment of the present disclosure.

FIG. 4 is a perspective view of a display device DD according to an embodiment of the present disclosure.

An upper surface of each component is parallel to a plane defined by a first direction axis DR1 and a second direction axis DR2. A thickness direction of each component is indicated by a third direction axis DR3. An upper side (or an upper portion) and a lower side (or a lower portion) of each component are separated by the third direction axis DR3. However, the directions indicated by the first to third direction axes DR1, DR2, and DR3 are relative concepts and may be converted into different directions. Hereinafter, the first to third directions refer to the same reference numerals in the directions indicated by the first to third direction axes DR1, DR2, and DR3, respectively.

The display device DD according to an embodiment may include a plurality of pixels PX. The pixels PX may be disposed in a matrix form. Each of the pixels PX may include the described luminescence devices LD1, LD2, and LD3 according to an embodiment of the present disclosure. At least some of the pixels PX may generate light having a different wavelength region, respectively. However, the embodiment is not limited thereto, and the pixels PX may generate light having the same wavelength region.

Figure 5:
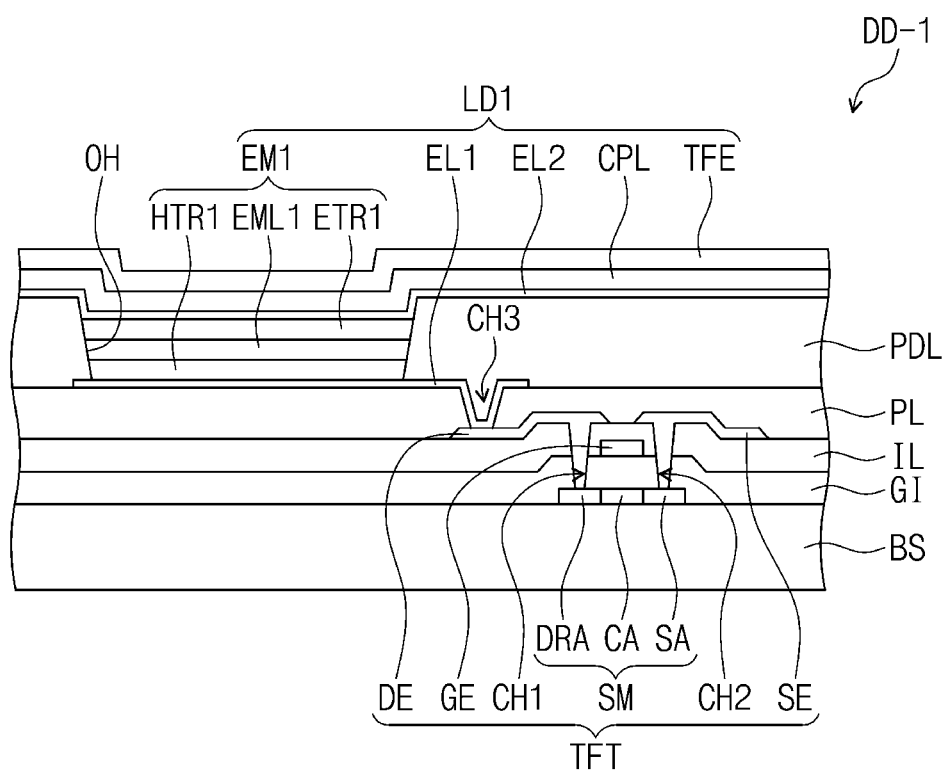
FIG. 5 is a cross-sectional view in which a portion of a display device according to an embodiment that is cut.

FIG. 5 is a partial cross-sectional view of a display device DD-1 according to an embodiment.

The display device DD-1 illustrated in FIG. 5 may correspond to the display device DD illustrated in FIG. 4.

Referring to FIG. 5, the display device DD-1 may include a base substrate BS, a thin film transistor TFT, a plurality of insulation layers GI and IL, a pixel definition layer PDL, and a luminescence device LD1.

The thin film transistor TFT and the luminescence device LD1 may be stacked on the base substrate BS. A material of the base substrate BS is not particularly limited as long as it is typically used, and the base substrate BS may be formed of an insulating material such as a glass, an organic polymer, and a crystal.

A substrate buffer layer may be disposed on the base substrate BS. The substrate buffer layer may serve to prevent or protect from diffusion of impurities into the thin film transistor TFT. The substrate buffer layer may be formed of silicon nitride ($SiN_x$), silicon oxide ($SiO_x$), silicon oxynitride ($SiO_xN_y$), or the like and may not be provided again depending on the material of the base substrate BS and process conditions.

A semiconductor layer SM may be disposed on the base substrate BS. The semiconductor layer SM may be formed of a semiconductor material and may serve as an active layer in the thin film transistor TFT. The semiconductor layer SM may include a source area SA, a drain area DRA, and a channel area CA disposed between the source area SA and the drain area DRA. The semiconductor layer SM may be formed of an inorganic semiconductor or an organic semiconductor. The source area SA and the drain area DRA may be doped with an N-type impurity or a P-type impurity.

A gate insulation layer GI may be disposed on the semiconductor layer SM. The gate insulation layer GI may cover the semiconductor layer SM. The gate insulation layer GI may be formed of an organic insulation material or an inorganic insulation material.

A gate electrode GE may be disposed on the gate insulation layer GI. The gate electrode GE may be formed to cover an area corresponding to the channel area CA of the semiconductor layer SM.

An interlayer insulation layer IL may be disposed on the gate electrode GE. The interlayer insulation layer IL may cover the gate electrode GE. The interlayer insulation layer IL may be formed of an organic insulation material or an inorganic insulation material.

A source electrode SE and a drain electrode DE may be disposed on the interlayer insulation layer IL. The drain electrode DE may be in contact with the drain area DRA of the semiconductor layer SM by a first contact hole CH1, which is formed through the gate insulation layer GI and the interlayer insulation layer IL, and the source electrode SE may be in contact with the source area SA of the semiconductor layer SM by a second contact hole CH2, which is formed through the gate insulation layer GI and the interlayer insulation layer IL.

A passivation layer PL may be disposed on the source electrode SE and the drain electrode DE. The passivation layer PL may serve as a protection film for protecting the thin film transistor TFT, and also may serve as a planarization film for planarizing upper surfaces thereof.

A detailed description of the luminescence device LD1 is the same as the above description, and thus, the detailed description thereof may not be provided again.

A first electrode EL1 may be provided on the passivation layer PL, and the pixel definition layer PDL may be provided on the passivation layer PL and the first electrode EL1. In the pixel definition layer PDL, an opening OH for exposing at least a portion of an upper surface of the first electrode EL1 may be defined. The pixel definition layer PDL may be configured to compart (or divide) the luminescence device LD1 to correspond to each of the pixels PX. A material of the pixel definition layer PDL is not particularly limited and suitable material(s) in the art may be used without limitation.

Figure 6:
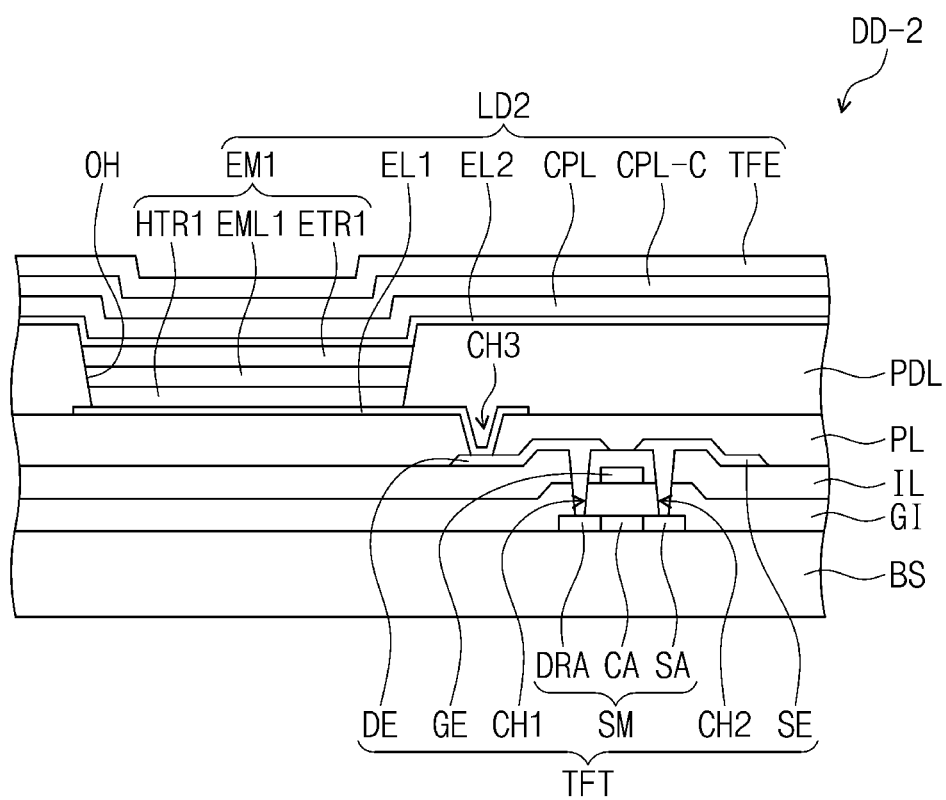
FIG. 6 is a partial cross-sectional view of a display device according to an embodiment.

FIG. 6 is a cross-sectional view in which a portion of a display device DD-2 according to an embodiment is cut. Referring to FIG. 6, the display device DD-2 may include the luminescence device LD2. The description for the display device DD-1 in FIG. 5 may be equally applied to the display device DD-2 illustrated in FIG. 6 except that the luminescence device LD2 further includes an auxiliary capping layer CPL-C disposed on the capping layer CPL.

Referring to FIGS. 5 and 6, in other words, the display device DD of an embodiment may include the luminescence devices LD1 and LD2 having the described single-layer capping layer CPL or multi-layer capping layers CPL and CPL-C. Although it is not illustrated, the display device DD may of course include the luminescence device LD3 including a plurality of emission portions EM1 and EM2.

Figure 7:
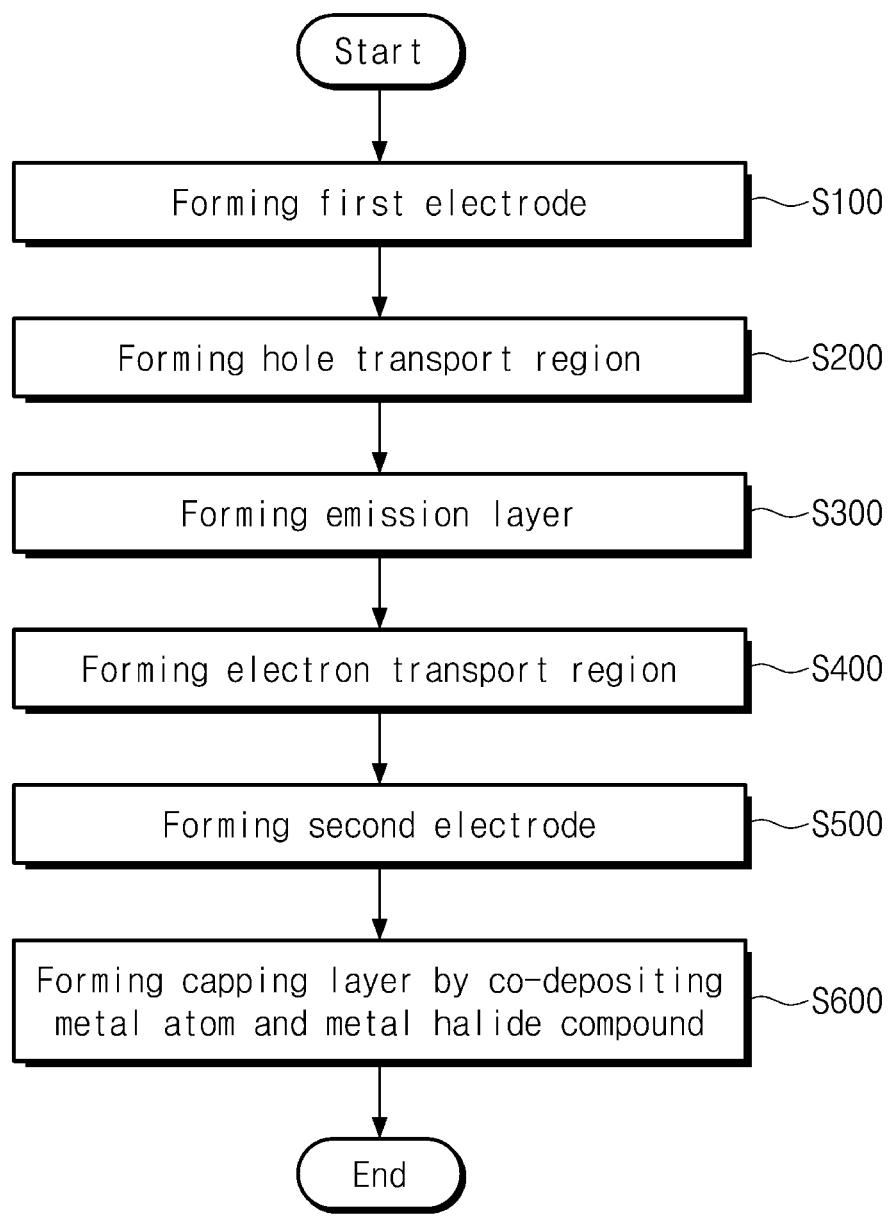
FIG. 7 is a schematic flow-chart of a method for manufacturing a luminescence device according to an embodiment.

Hereinafter, a method for manufacturing the described luminescence device will be described with reference to FIG. 7. FIG. 7 is a schematic flow-chart of a method for manufacturing a luminescence device according to an embodiment.

Referring to FIG. 7, a method for manufacturing the luminescence device LD1 according to an embodiment of the present disclosure may include: a task S100 for forming a first electrode EL1; a task S200 for forming a first hole transport region HTR1 on the first electrode EL1; a task S300 for forming a first emission layer EML1 on the first hole transport region HTR1; a task S400 for forming a first electron transport region ETR1 on the first emission layer EML1; a task S500 for forming a second electrode EL2 on the first electron transport region ETR1; and a task S600 for forming a capping layer CPL by co-deposition of a metal atom and a metal halide compound.

The task S100 for forming the first electrode EL1, the task S200 for forming the first hole transport region HTR1, the task S300 for forming the first emission layer EML1, the task S400 for forming the first electron transport region ETR1, and the task S500 for forming the second electrode EL2, respectively, may be performed by using suitable method(s) in the art. For example, each task may be performed by using a vacuum deposition method. However, the embodiment is not limited thereto and may also be performed by using a spin coating method, a casting method, a Langmuir-Blodgett (LB) method, an inkjet printing method, a laser printing method, and/or a laser induced thermal imaging (LITI) method.

The task S600 for forming the capping layer CPL may be performed by co-depositing the metal atom and the metal halide compound. However, the embodiment is not limited thereto and may be performed by a method in which the metal atom and the metal halide compound are mixed, and then, the mixture is applied onto the second electrode EL2. For example, the task S600 for forming the capping layer CPL may also be performed by a method in which the metal atom and the metal halide compound are mixed and first heated to form a ternary compound, and then, the ternary compound is deposited.

The task S600 for forming the capping layer CPL may be performed by co-depositing the metal atom and the metal halide compound at a volume ratio of 2:8 to 8:2 (which can also be referred the metal atom content and the metal halide compound content at the volume ratio of 2:8 to 8:2). When the ratio of the metal atom content exceeds the described ratio range, the remaining metal atom content (i.e., the remaining metal atoms) may be too high in content and may not be able react to form the ternary compound (by reacting with) the metal halide content (i.e., the metal halide compounds). Accordingly, transmittance of the capping layer CPL may be lowered and the light-extraction efficiency thereof may also be lowered. When the described ratio range is satisfied, said problem may not occur.

Furthermore, because the metal atom and the metal halide compound of an embodiment have high process stability, the capping layer CPL may be formed by using a suitable equipment typically used in the art.

The task S600 for forming the capping layer CPL may be performed by co-depositing Yb and RbI. When Yb and RbI are co-deposited, Yb and RbI may react to form a ternary compound, $RbYbI_3$. Since the method for manufacturing a luminescence device LD1 according to an embodiment of the present disclosure includes forming a capping layer CPL using an inorganic material, a luminescence device LD1 maintaining high-reliability under a high-temperature and high-humidity environment may be formed and a capping layer CPL having a desired refractive index may be produced.

In an embodiment, because the capping layer CPL has a desired refractive index, it is unnecessary to further form a separate optical layer, thereby simplifying the process and reducing the process cost.

In some embodiments, the method for manufacturing a luminescence device LD1 of an embodiment may further include forming a thin film encapsulation layer TFE which is directly disposed on the capping layer CPL.

A method for manufacturing a luminescence device LD2 having a plurality of capping layers CPL and CPL-C may be substantially the same as the method for manufacturing the luminescence device LD1 having a single capping layer CPL except that forming an auxiliary capping layer CPL-C disposed on a capping layer CPL is further included. The task for forming the auxiliary capping layer CPL-C may be substantially the same as the task S600 for forming the capping layer CPL.

Figure 8:
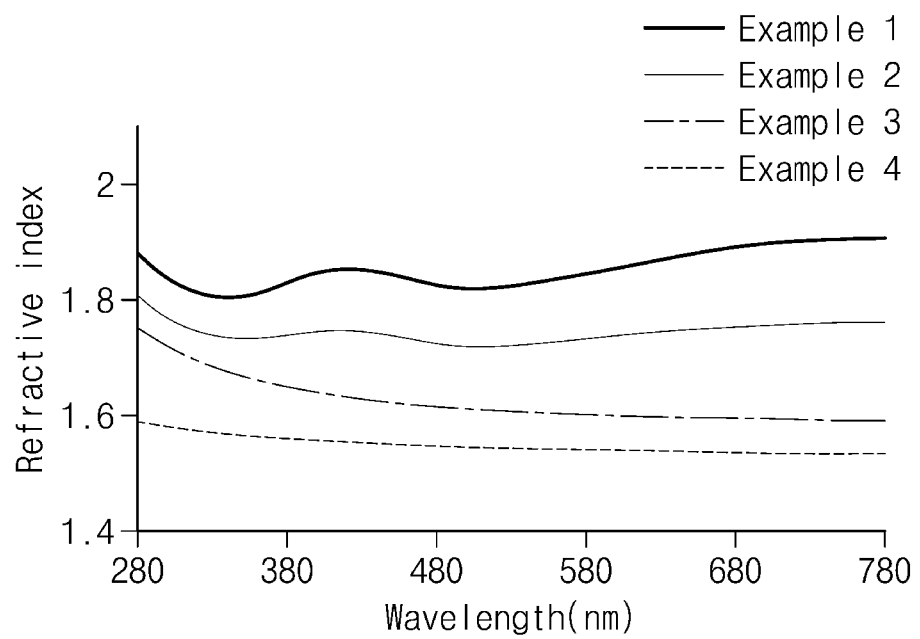
FIG. 8 is a graph showing a refractive index of a capping layer according to an embodiment.

Hereinafter, embodiments of the present disclosure will be described in more detail with reference to specific Examples and FIG. 8. Examples below are provided for illustrative purposes only, and the scope of the inventive concept is not limited thereto. FIG. 8 is a graph showing a refractive index of a capping layer CPL according to an embodiment.

Example 1

A capping layer according to Example 1 was formed as follows:
Yb and RbI were co-deposited at a volume ratio of 2:1 on a substrate to form a capping layer.

Example 2

A capping layer according to Example 2 was formed in the same manner as in Example 1 except that Yb and RbI were co-deposited at a volume ratio of 1:1.

Example 3

A capping layer according to Example 3 was formed in the same manner as in Example 1 except that Yb and RbI were co-deposited at a volume ratio of 1:2.

Example 4

A capping layer according to Example 4 was formed in the same manner as in Example 1 except that Yb and RbI were co-deposited at a volume ratio of 1:4.

Refractive indices of (i.e., refractive index of each of) the capping layers according to Examples 1 to 4 were measured depending on emission wavelengths, and the results are shown in FIG. 8.

The refractive indices in Examples 1 to 4 were measured as follows. The capping layer was irradiated with light having each wavelength in a vacuum state at 25° C. Thereafter, a ratio of the sine function value of an incident angle of the light to the capping layer and the sine function value of a refraction angle of the light to the capping layer was measured.

Referring to FIG. 8, the refractive index of the capping layer may be variously adjusted by adjusting the ratio of Yb and RbI. In comparison, when the capping layer was formed by using an organic material, the refractive index of the capping layer was difficult to deviate from the refractive index range of about 1.5-1.7.

In the luminescence devices according to Examples 1 to 4, the ratio of Yb and RbI was adjusted, and Yb and RbI were co-deposited, and accordingly, a capping layer having a refractive index range of about 1.4-2.0 was formed. Accordingly, it may be possible to manufacture luminescence devices having various refractive index ranges required for each display device, and the luminescence device of an embodiment may be achieved to have high light-extraction efficiency by including the capping layer of an embodiment. That is, in an embodiment, the capping layer having a desired refractive index can be easily formed by suitably adjusting a ratio of the metal atom content and the metal halide compound content in the capping layer CPL, e.g., by adjusting the volume ratio of the metal atom content and the metal halide compound content to be 2:8 to 8:2.

The present disclosure provides the luminescence devices LD1, LD2, and LD3, which include the capping layer CPL containing a metal atom and a metal halide compound. Accordingly, the luminescence devices LD1, LD2, and LD3 of an embodiment, and the display devices DD, DD-1, and DD-2 including said luminescence devices, may maintain high-reliability under a high-temperature and high-humidity environment.

The present disclosure also provides the luminescence devices LD1, LD2, and LD3, which have high light-extraction efficiency because it is easy to adjust the refractive index of the capping layer CPL by using a metal atom and a metal halide compound as a capping layer CPL material, and the display devices DD, DD-1, and DD-2 including said luminescence devices.

According to an embodiment of the present disclosure, a luminescence device and a display device including the same may maintain high-reliability under a high-temperature and high-humidity environment.

According to an embodiment of the present disclosure, a luminescence device and a display device including the same may have high light-extraction efficiency.

As used herein, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all sub-ranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

Although the exemplary embodiments of the present invention have been described, it is understood that the present invention should not be limited to these exemplary embodiments and that various changes and modifications can be made thereto by one of ordinary skill in the art within the spirit and scope of the present invention as claimed in the following claims and equivalents thereof.

What is claimed is:

1. A luminescence device comprising:
   a first electrode;
   a first emission portion on the first electrode;
   a second electrode on the first emission portion and having a first surface facing the first electrode and a second surface facing oppositely away from the first surface;
   a capping layer on the second surface of the second electrode and comprising a metal atom and a metal halide compound; and
   an auxiliary capping layer on the capping layer and comprising the metal atom and the metal halide compound and not comprising an organic compound,
   wherein the metal atom contains at least one of a lanthanide metal, a transition metal, or a post-transition metal, and the metal halide compound is formed by combining an alkali metal atom and a halogen atom,
   wherein a volume ratio of the metal atom and the metal halide compound is 1:2, 1:4, or 2:1,
   wherein the second electrode is between the capping layer and the first electrode,
   wherein the capping layer is between the auxiliary capping layer and the second electrode, and
   wherein the auxiliary capping layer is different in refractive index from that of the capping layer.

2. The luminescence device of claim 1, wherein the capping layer does not comprise an organic compound.

3. The luminescence device of claim 1, wherein the halogen atom contains at least one of CI, Br, or I.

4. The luminescence device of claim 1, wherein the metal halide compound contains at least one of LiI, NaI, KI, RbI, or CsI.

5. The luminescence device of claim 1, wherein the metal atom and the metal halide compound are bonded to each other to form a ternary compound.

6. The luminescence device of claim 5, wherein the ternary compound is represented by Formula 1 below:

$$X_n Y_m Z_q \qquad \text{[Formula 1]}$$

wherein in Formula 1,
X and Y are each independently an alkali metal, a transition metal, or a post-transition metal,
Z is a halogen atom, and
n, m, and q are each independently an integer of 1 to 5.

7. The luminescence device of claim 6,
wherein in Formula 1,
X is an alkali metal,
Y is a transition metal or a post-transition metal,
n and m are each 1, and
q is 3.

8. The luminescence device of claim 5, wherein the ternary compound contains at least one of $KYbI_3$, $RbYbI_3$, $CsYbI_3$, $NaYbI_3$, $LiYbI_3$, $RbSmI_3$, $CsSmI_3$, $KSmI_3$, $NaSmI_3$, or $LiSmI_3$.

9. The luminescence device of claim 1, further comprising a thin film encapsulation layer directly on the capping layer.

10. The luminescence device of claim 1,
wherein the first emission portion comprises an emission layer, and
wherein
the emission layer is an organic emission layer comprising an organic compound, or
the emission layer is a quantum dot emission layer comprising a quantum dot.

11. The luminescence device of claim 1, further comprising a second emission portion,
wherein the first emission portion comprises: a first hole transport region; a first emission layer on the first hole transport region; and a first electron transport region on the first emission layer, and
the second emission portion comprises: a second hole transport region; a second emission layer on the second hole transport region; and a second electron transport region on the second emission layer.

12. The luminescence device of claim 1, wherein the capping layer has a refractive index of 1.4-2.0 in a wavelength range of 280-780 nm.

13. A luminescence device comprising:
a first electrode;
a hole transport region on the first electrode;
an emission layer on the hole transport region;
an electron transport region on the emission layer;
a second electrode on the electron transport region and having a first surface facing the first electrode and a second surface facing oppositely away from the first surface;
a capping layer on the second surface of the second electrode and comprising a metal atom and a metal halide compound; and
an auxiliary capping layer on the capping layer and comprising the metal atom and the metal halide compound and not comprising an organic compound,
wherein the metal atom contains at least one of a lanthanide metal, a transition metal, or a post-transition metal and the metal halide compound is formed by combining an alkali metal atom and a halogen atom,
wherein a volume ratio of the metal atom and the metal halide compound is 1:2, 1:4, or 2:1,
wherein the second electrode is between the capping layer and the first electrode,
wherein the capping layer is between the auxiliary capping layer and the second electrode, and
wherein the auxiliary capping layer is different in refractive index from that of the capping layer.

14. The luminescence device of claim 13, wherein the metal atom contains at least one of Eu, Sm, or Yb.

15. The luminescence device of claim 13, wherein the metal halide compound is formed by combining an alkali metal atom and an iodine atom.

16. A display device comprising:
a thin film transistor; and
a luminescence device on the thin film transistor,
wherein the luminescence device includes:
a first electrode,
a hole transport region on the first electrode,
an emission layer on the hole transport region,
an electron transport region on the emission layer,
a second electrode on the electron transport region and having a first surface facing the first electrode and a second surface facing oppositely away from the first surface,
a capping layer on the second surface of the second electrode and comprising a metal atom and a metal halide compound, and
an auxiliary capping layer on the capping layer and comprising the metal atom and the metal halide compound and not comprising an organic compound,
wherein the metal atom contains at least one of a lanthanide metal, a transition metal, or a post-transition metal and the metal halide compound is formed by combining an alkali metal atom and a halogen atom,
wherein a volume ratio of the metal atom and the metal halide compound is 1:2, 1:4, or 2:1,
wherein the second electrode is between the capping layer and the first electrode,
wherein the capping layer is between the auxiliary capping layer and the second electrode, and
wherein the auxiliary capping layer is different in refractive index from that of the capping layer.

17. The display device of claim 16,
wherein the metal atom contains at least one of Eu, Sm, or Yb, and
the metal halide compound contains at least one of LiI, NaI, KI, RbI, or CsI.

18. The display device of claim 16, wherein the capping layer comprises at least one of $KYbI_3$, $RbYbI_3$, $CsYbI_3$, $NaYbI_3$, $LiYbI_3$, $RbSmI_3$, $CsSmI_3$, $KSmI_3$, $NaSmI_3$, or $LiSmI_3$.

* * * * *